United States Patent [19]

Braginsky

[11] Patent Number: 4,881,863

[45] Date of Patent: Nov. 21, 1989

[54] APPARATUS FOR INSPECTING WAFERS

[75] Inventor: Sidney Braginsky, Dix Hills, N.Y.

[73] Assignee: Primary Systems Corporation, Danbury, Conn.

[21] Appl. No.: 134,012

[22] Filed: Dec. 17, 1987

[51] Int. Cl.[4] ............................................. B65H 5/12
[52] U.S. Cl. ..................................... 414/225; 29/720;
 209/546; 209/581; 382/8; 382/46; 901/47
[58] Field of Search .................. 414/225, 222, 744 R,
 414/744 A, 744 B, 754, 758, 776, 781, 783, 718,
 744.1, 744.2, 744.3, 744.7; 901/46, 47, 14,
 16–18; 209/587, 538, 545, 903, 546, 581;
 364/513; 198/775; 382/8, 46; 356/71, 394;
 29/705, 720

[56] References Cited

U.S. PATENT DOCUMENTS

| 3,522,838 | 8/1970 | Ott ................................. 414/744 A |
| 3,816,746 | 6/1974 | Gugliotta et al. .............. 209/587 X |
| 4,187,051 | 2/1980 | Kirsch et al. ........................ 414/744 |
| 4,274,802 | 6/1981 | Inaba et al. ..................... 414/758 X |
| 4,298,307 | 11/1981 | Bergman ..................... 414/774 R X |
| 4,501,527 | 2/1985 | Jacoby et al. ....................... 414/225 |
| 4,518,078 | 5/1985 | Garrett ................................ 198/775 |
| 4,547,119 | 10/1985 | Chance et al. .................. 414/718 X |
| 4,584,045 | 4/1986 | Richards ........................ 414/222 X |

FOREIGN PATENT DOCUMENTS

| 15941 | 1/1985 | Japan . |
| 195948 | 10/1985 | Japan . |
| 760244 | 9/1980 | U.S.S.R. . |
| 1238946 | 6/1986 | U.S.S.R. .............................. 901/46 |

OTHER PUBLICATIONS

"Automatic Wafer Transfer and Turnover Tool", Western Electric Technical Digest, No. 49, Jan. 1978, B. C. Abraham, C. R. Fogley, pp. 1, 2.
"Clean Room Robot", IBM Technical Disclosure Bulletin, vol. 25, No. 4, Sep. 1982, R. E. Floyd, A. S. Gasparri, R. D. Glaeser, E. P. Hecker, F. T. Majewski, L. W. Manthei, D. L. Miller, C. D. Riggs, R. C. Stanley, D. B. Vozzola.
IBM Technical Disclosure Bulletin, vol 20, No. 3, pp. 1100–1101, 8/77.

Primary Examiner—Robert J. Spar
Assistant Examiner—Donald W. Underwood
Attorney, Agent, or Firm—Ostrolenk, Faber, Gerb & Soffen

[57] ABSTRACT

An apparatus for inspecting semiconductor, or other types of, wafers is disclosed. The apparatus uses a robot arm to move wafers from an incoming location to an inspection location, and then to an outgoing location. The robot arm may be supported on a floating platform to prevent mechanical chafing and resulting contamination. The robot arm is constructed to have a free end which moves laterally, but not vertically. The arm may be retractable to reduce wobble when the wafer is being inspected. A wafer in the inspection position is inspected by scanning with an objective lens coupled to an associated optical system. If desired, an automatic discrimination system can be coupled to the optical system to permit discrimination between acceptable and non-acceptable wafers. The objective lens may face upwardly and the wafer downwardly to urge contaminants to fall from the wafer. The inspection apparatus may be mounted on a table and shielded by a housing over the table to maintain the cleanliness of the inspection environment.

12 Claims, 2 Drawing Sheets

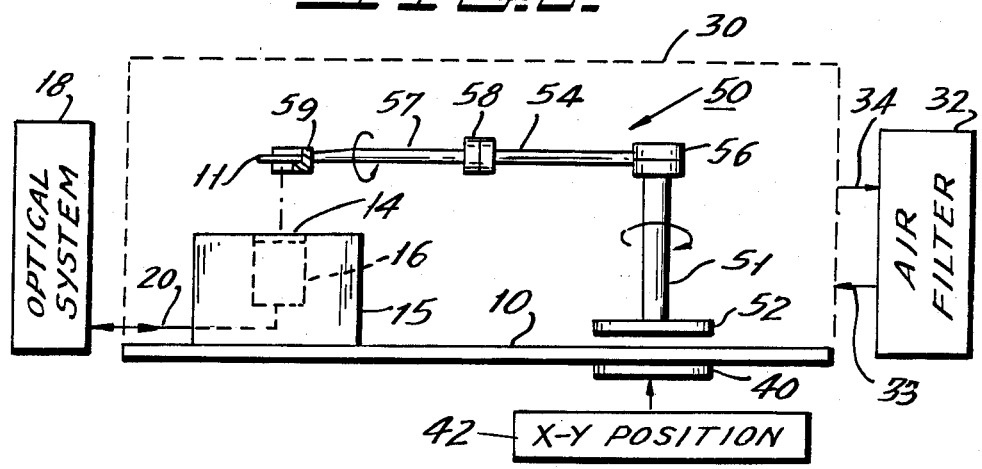
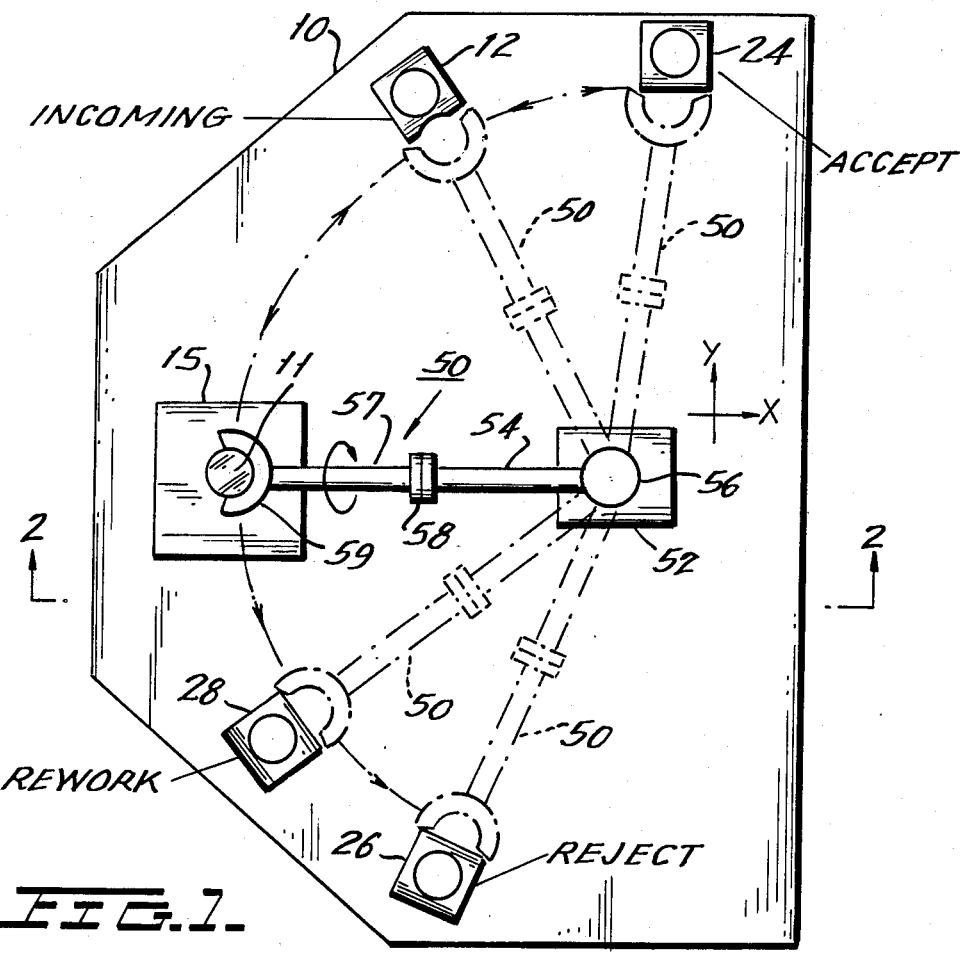

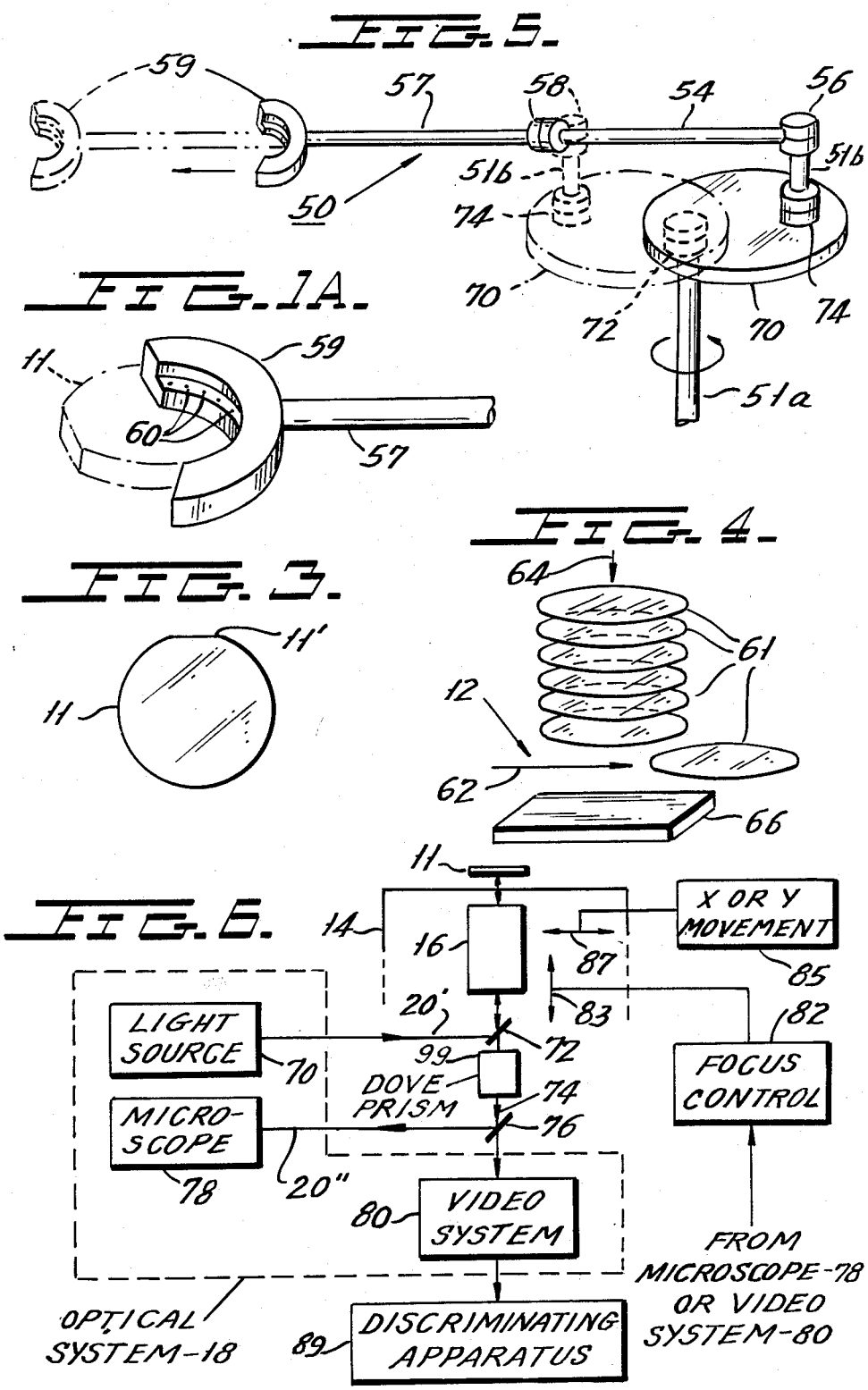

APPARATUS FOR INSPECTING WAFERS

BACKGROUND OF THE INVENTION

The present invention relates to apparatus for inspecting wafers, and more particularly to such an apparatus using a robot arm to manipulate a wafer from an incoming position to an inspection position.

When wafers are processed to define features on the wafer, with photolithographic patterns, for example, it is customary to inspect the features to assure that they are correctly made. Inspection typically occurs several times during such processing. In the semiconductor arts, for example, semiconductor wafers are repeatedly inspected during processing to determine, for instance, whether semiconductor junction patterns or other features have been correctly formed on the wafers, and whether harmful contaminants have collected on the wafers.

Technicians are customarily employed to inspect wafers during processing. In common practice, a technician transports a wafer from an incoming position to a viewing area of a microscope. The wafer is placed feature-side up, which is conventional for microscope viewing. After inspection, the technician moves the wafer to a respective outgoing position for acceptable wafers or rejected wafers, for example. Problems arise with this practice, since even if the technician inspects the wafers in a specially prepared clean room, contaminants from the technician's hair or clothes can find their way to the wafers. Such contaminants may be viewed as flaws and cause unnecessary rejection of wafer.

Such conventional inspection of wafers by technicians is also labor intensive.

OBJECTS AND SUMMARY OF THE INVENTION

An object of the present invention is to provide a wafer inspection apparatus that automates the wafer transport function previously performed by technicians.

A further object of the invention is to provide a wafer inspection apparatus utilizing simple mechanical means for manipulating wafers.

Another object of the invention is to provide a wafer inspection apparatus in which the wafer environment is maintained at a high degree of cleanliness to prevent unnecessary rejection of wafers.

In a preferred form of the invention, an apparatus for inspecting a wafer is provided. The apparatus comprises robot arm means for gripping a wafer at an incoming location, laterally transporting the wafer to an inspection location adjacent an optical port, and then placing the wafer in one of several outgoing locations. The apparatus includes optical means for viewing the wafer. Such optical means includes an objective lens aligned with the optical port. A further means is provided for supporting the robot means and optical means, and preferably for shielding these means (and thus the wafers) from an external environment.

Preferably, the objective lens is positioned to face upwardly, and the robot means inverts wafers to be inspected. In this way, contaminants on the wafers are urged to fall away from the wafers. This prevents unnecessary rejection of wafers due to contamination.

BRIEF DESCRIPTION OF THE DRAWINGS

The above objects as well as other objects of this invention shall become readily apparent after reading the following description of the accompanying drawings in which:

FIG. 1 is a top plan view of a wafer inspection apparatus of the invention.

FIG. 1A is an enlarged detail view of a wafer gripping device on the robot arm shown in FIG. 1.

FIG. 2 is a cross-sectional view of the apparatus of FIG. 1 taken at arrows 2—2 in FIG. 1.

FIG. 3 is a top plan view of a wafer showing a flat section along its periphery for registration purposes.

FIG. 4 is a diagrammatic perspective view of a conventional wafer cassette with means to elevate the wafers.

FIG. 5 is a detail view of a robot arm with a retractable gripping device that may be used in the apparatus of FIG. 1.

FIG. 6 is a view of the objective lens 16 shown in FIG. 2 and of associated apparatus for inspecting wafers.

DESCRIPTION OF THE PREFERRED EMBODIMENTS

FIGS. 1 and 2 show simplified top and cross-section views, respectively, of a wafer inspection apparatus in accordance with the invention. A robot arm, generally designated 50, is mounted above a table 10. Robot arm 50, shown in phantom at various positions, lifts a wafer 11 from an incoming wafer holder, or cassette, 12, and moves it over an optical port 14 (FIG. 2) in housing 15. The features of wafer 11 to be inspected are on the upper surface of the wafer when held by cassette holder 12. The robot arm 50 rotates wafer 11 so that it is inverted when over optical port 14. An objective lens 16 (FIG. 2), shown in block form, is aligned with optical port 14 so as view wafer 11 when the wafer is placed above port 14. The image of wafer 11 is transmitted to an optical system 18 via optical link 20. The focussing of objective lens 16 onto wafer 11 is described below.

Optical system 18, further, orients itself to the angular position of wafer 11. As FIG. 3 shows, wafer 11 may have a flat edge section 11' which can be detected by conventional pattern recognition apparatus (not shown) if desired. Alternatively, wafer 11 may have a notch, registration pattern or design (not shown), for example. The image of wafer 11 viewed by objective lens 16 can thus be rotated, if necessary, with one of several conventional optical rotation devices, such as a dove prism, before the features of the wafer are examined.

After inspection, wafer 11 is placed in an outgoing cassette, such as a cassette 24 (FIG. 1) for acceptable wafers, a cassette 26 for rejected wafers too defective to correct, and a cassette 28 for wafers which can be reworked.

Preferably, a housing 30, shown in FIG. 2 in dashed lines, covers robot arm 50, the wafer cassettes 12, 24, 26 and 28 and housing 15 for objective lens 16. Housing 30 may be of standard construction of shield the wafer being inspected from the outside environment, which is usually contaminated. Suitable doors (not shown) are provided in housing 30 to permit insertion and removal of wafer cassettes. An air filter 32, with respective inlet and outlet ports 33 and 34 to and from housing 30 is preferably used to maintain the cleanliness of the environment within housing 30. The wafer environment can thus be kept stringently clean, for example, to a maximum of one contaminant particle per cubic meter for particles exceeding 3/10 micron in diameter.

As shown in FIG. 2, arm 50 comprises a vertical post 51 mounted on a platform 52. As FIG. 2 shows, platform 52 floats above table 10. To realize this preferred feature, table 10 could be designed to magnetically interact with platform 52 in known manner, or platform 52 could be suspended on a cushion of air by conventional air bearings (not shown). A positioning device 40, corresponding to platform 52, magnetically interacts with the platform to keep it aligned with the platform. An X-Y positioner 42 adjusts the X-Y position of device 40, which correspondingly sets the X-Y position of robot arm platform 52. The "X" and "Y" directions, as used herein, are illustrated in FIG. 1, and lie in a generally horizontal plane. X-Y positioner 42 may include a stepping motor which is computer-controlled in known manner.

Robot arm 50 includes lateral arm section 54, which pivots laterally about post 51 via rotary coupling 56. Robot arm 50 includes further lateral section 57, which pivots, via rotary coupling 58, about its own axis with respect to arm section 54. The free end of section 57 contains a gripping device 59, which may use vacuum or mechanical pressure to grip a wafer. Rotary couplings 56 and 58 contain rotational drive means (not shown), which are preferably computer-controlled in known manner.

Gripping device 59 can thus pivot about post 51, and rotate about the axis of arm section 57. Beneficially, device 59 need not move up or down, which avoids mechanisms much more complex than the simple rotary couplings 56 and 58.

FIG. 1A shows gripping device 59 as a vacuum device. A plurality of vacuum ports 60 apply suction to the lower peripheral edge of wafer 11, which is shown in phantom. Vacuum device 59 may be of known construction.

Wafers are lifted from the cassettes 12, 24, 26, 28 on table 10 into position for being gripped by device 59, via an elevator means (not shown) internal to the cassettes. Such elevator means may be of known construction and its operation is diagrammatically shown in FIG. 4 for incoming cassette 12. In FIG. 4, the lowermost one of a stack of wafers 61 moves to the right as shown by an arrow 62 so that gripping device 59 (FIG. 1A) can reach under it and grasp it. The stack of wafers 61 then moves downwardly as indicated by arrow 64, so that the lowermost wafer can be moved to the right for gripping by device 59. The outgoing cassettes 24, 26 and 28 operate in reverse manner.

Robot arm 50 is moved in several stages to grip a wafer from incoming cassette 12 and place the wafer above optical port 14 for viewing. The X-Y position of platform 52 may be first adjusted to a "home" site so that gripping device 59 can be moved into position to grip a wafer in incoming cassette 12. The gripping device 59 is initially pivoted about post 51 to the necessary angular position to grip such wafer. The preceding steps may occur in any order or together.

Robot arm section 57 then rotates about post 51 to place the wafer and gripping device 59 above optical port 14. Robot arm section 57, additionally, rotates about its own axis to invert the wafer prior to placing the wafer above optical port 14. Such rotation of section 57 may occur at any unobstructed location, such as midway between cassette 12 and optical port 14.

X-Y positioner 42 then moves robot arm 50 into position to begin scanning of wafer 11. In a preferred scanning sequence, X-Y positioner 42 controls X direction movement of wafer 11 and a further means, discussed below, controls Y direction movement of objective lens 16, or vice-versa. X-Y positioner 42 could, if desired, control both X and Y movement of wafer 11, or even scan in patterns non-aligned with the X and Y directions. After inspection, robot arm 50 moves to the home X-Y site and rotates about post 51 to enable gripping device 59 to deliver the wafer to a respective outgoing cassette 24, 26 or 28.

Gripping device 59 on robot arm 50 may wobble considerably when brought to a stop above optical port 14 if its center of gravity is spaced a long way from post 51. Such wobble may delay inspection until it "dies" down. To reduce such wobble, robot arm 50 may be modified as shown in FIG. 5.

In FIG. 5, the vertical post 51a, 51b of robot arm 50 is shown split into sections 51a and 51b. These sections are coupled by an eccentric member 70, which is coupled to post sections 51a and 51b via rotary couplings 72 and 74, respectively. In FIG. 5 gripping device 59 is shown in a retracted position in the solid-line view. In such retracted position, the gripping device 59 is aligned above optical port 14 (FIG. 1). The phantom-line view in FIG. 5 shows gripping device 59 in an extended position. While extended, the gripping device 59 can reach the various cassettes for gripping or releasing wafers.

Other means for retracting gripping device 59 towards post 51 will be apparent to those who are skilled in the art and aware of the present disclosure. Any such retraction mechanism, however, should minimize mechanical chafing between adjacent parts, which might generate contaminants within housing 30.

FIG. 6 illustrates objective lens 16 and associated apparatus for inspecting wafers. Such apparatus includes optical system 18, shown in FIG. 2 in more general form. A light source 70 provides light to a polarizing mirror 72 along optical path 20' (corresponding to optical link 20 in FIG. 2). Optical path 20' may be a fiber-optic cable, for example. Mirror 72 reflects light from path 20' upwardly through objective lens 16 to illuminate wafer 11. Reflected light from the wafer is transmitted straight through mirror 72, along path 74 to a beam splitter 76. A portion of beam 74 reflects off mirror 76 to reach a microscope 78 via optical path 20'', for viewing by a technician. A further portion of light beam 74 passes straight through beam splitter 76 to video system 80, which may include an image monitor for viewing by a technician. The invention can be embodied with either or both microscope 78 and video system 80.

Optical link 74 may include a dove prism 99, as mentioned above, to rotate the image on the link if necessary for proper viewing.

To focus objective lens 16 upon wafer 11, a focus control 82 adjusts the spacing between wafer 11 and objective lens 16, preferably by moving lens 16 up and down as shown by double-headed arrow 83. Focus control 82 may use standard laser-based or video-based autofocus control in conjunction with the optics in microscope 78 or in video system 80. Alternatively, focus control 82 may be manual and controlled by a technician using the microscope or the video system.

A movement means 85 moves objective lens 16, and its associated apparatus, in an X or Y direction, for example, as shown by double-headed arrow 87, for wafer scanning purposes. Such X or Y movement can be accomplished by a stepping motor, for example, contained in movement means 85, which is computer-controlled in known manner.

The present invention enables fully automatic inspection of wafers by including a discriminating apparatus 89, which receives image information from video system 80. Discriminating apparatus 89 may be conventional and comprise pattern recognition apparatus and, optionally, image enhancement equipment to emphasize features of interest on wafer 11.

The foregoing describes apparatus for inspection of wafers that automatically transports the wafers. The inspection can occur in a stringently clean environment and, in a preferred embodiment, the apparatus inverts the wafers before inspection to urge contaminants to fall from the wafer. The apparatus beneficially uses a robot arm that completes all necessary movements without the need for up-down movement.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. Apparatus for inspecting a wafer, comprising:
   optical means for optically viewing a wafer, including an objective lens and a viewing device that are interconnected by an optical link;
   robot arm means for receiving the wafer from an incoming location, laterally transporting the wafer to an inspection location for viewing by the objective lens, and then placing the wafer in an outgoing location after inspection;
   the robot arm means including a gripping device for continually gripping the wafer during its transit from the incoming to the outgoing location;
   the optical link including means for optically rotating as necessary a wafer image received by the objective lens so as to transmit to the viewing device a wafer image with a desired angular orientation; and
   means for supporting the robot arms means and the optical means, including scanning means for scanning the objective lens across the wafer when the wafer is in the inspection location.

2. The apparatus of claim 1, wherein the supporting means includes means for shielding the robot arm means and the optical means from an external environment.

3. The apparatus of claim 1, wherein the arm supporting means includes a first scan means for moving the robot arm means.

4. The apparatus of claim 3, wherein the arm supporting means further includes second scan means for moving the objective lens, and wherein the first and second scan means move the robot arm means and objective lens, respectively, orthogonally to each other.

5. The apparatus of claim 1, wherein:
   the robot arm means comprises a wafer gripping device, a movable arm supporting the wafer gripping device, and a base supporting the arm; and
   the arm supporting means includes a positioning means for laterally positioning the base.

6. The apparatus of claim 5, wherein the means for supporting the robot arm means and the optical means includes a table and means to float the base above the table.

7. The apparatus of claim 6, wherein the supporting means further includes means for shielding the robot arm means and the optical means from an external environment.

8. The apparatus of claim 5, wherein the robot arm means includes a generally vertical post supported by the base and a first coupling; the first coupling being positioned atop the post, supporting the moveable arm and permitting the moveable arm to pivot laterally about the post.

9. The apparatus of claim 8, wherein the moveable arm comprises:
   a first elongated section attached to the first coupling;
   a second elongated section aligned along an axis with the first section and supporting the wafer gripping device; and
   a second coupling joining the first and second sections and permitting the wafer gripping device to rotate about the axis of the first and second arm sections.

10. The apparatus of claim 5, wherein the robot arm means includes a means for laterally retracting the arm relative to the base and holding the arm in a retracted position when the water is in the inspection location so as to reduce wobble in the arm during wafer inspection.

11. The apparatus of claim 1, further comprising discriminating means coupled to the optical means for automatically discriminating between acceptable and non-acceptable wafers.

12. The apparatus of claim 1, wherein:
   the objective lens is positioned to view upwardly;
   the robot arm means is further provided with means for inverting the wafer before placing it in the inspection location; and
   the supporting means includes scanning means for moving the robot arm means when the wafer is in the inspection location.

* * * * *